(12) United States Patent
Ang et al.

(10) Patent No.: US 12,080,376 B2
(45) Date of Patent: Sep. 3, 2024

(54) SKIPPING PAGES FOR WEAK WORDLINES OF A MEMORY DEVICE DURING PRE-PROGRAMMING

(71) Applicant: Micron Technology, Inc., Boise, ID (US)

(72) Inventors: Cheng Cheng Ang, Singapore (SG); Chun Lei Kong, Singapore (SG); Ting Luo, Santa Clara, CA (US); Aik Boon Edmund Yap, Singapore (SG)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 17/718,617

(22) Filed: Apr. 12, 2022

(65) Prior Publication Data

US 2022/0351762 A1 Nov. 3, 2022

Related U.S. Application Data

(60) Provisional application No. 63/181,846, filed on Apr. 29, 2021.

(51) Int. Cl.
| | |
|---|---|
| *G11C 7/10* | (2006.01) |
| *G06F 12/02* | (2006.01) |
| *G11C 8/08* | (2006.01) |
| *G11C 29/12* | (2006.01) |

(52) U.S. Cl.
CPC ........ *G11C 7/1096* (2013.01); *G06F 12/0238* (2013.01); *G11C 7/1045* (2013.01); *G11C 7/1063* (2013.01); *G11C 7/1069* (2013.01); *G11C 8/08* (2013.01); *G11C 2029/1202* (2013.01)

(58) Field of Classification Search
CPC ... G11C 7/1096; G11C 7/1045; G11C 7/1063; G11C 7/1069; G11C 8/08; G11C 2029/1202; G06F 12/0238
USPC .................................................... 365/185.23
See application file for complete search history.

(56) References Cited

U.S. PATENT DOCUMENTS

2020/0234780 A1\* 7/2020 Papandreou ....... G11C 16/3418

\* cited by examiner

*Primary Examiner* — Huan Hoang
(74) *Attorney, Agent, or Firm* — Holland & Hart LLP

(57) ABSTRACT

Methods, systems, and devices for skipping pages for weak wordlines of a memory device during pre-programming are described. A memory device may be configured to operate in a first mode involving skipping one or more pages (e.g., a lower page (LP)) associated with a set of wordlines. In some examples, a testing system may determine the set of wordlines (e.g., weak wordlines) for which to skip pages according to performance degradation for the wordlines in response to applying a threshold temperature to a test memory device. In the first mode, the memory device may store (e.g., pre-program) data in a subset of pages distinct from the skipped pages. The memory device may switch to a second mode in response to a trigger condition. In the second mode, the memory device may use each page associated with the wordlines and may refrain from skipping the one or more pages.

34 Claims, 9 Drawing Sheets

| WL | Level | Sub-Block 305 | | | Sub-Block 310 | | |
|---|---|---|---|---|---|---|---|
| | | XP | UP | LP | XP | UP | LP |
| 0 | 0 | ■ | ■ | ■ | ■ | ■ | ■ |
| 1 | 0 | ■ | ■ | ■ | ■ | ■ | ■ |
| 2 | 1 | ■ | ■ | | ■ | ■ | |
| 3 | 2 | ■ | | | ■ | | |
| 4 | 3 | | | | | | |
| 5 | 3 | | | | | | |
| 6 | 3 | | | | | | |
| 7 | 3 | | | | | | |
| 8 | 3 | | | | | | |
| 9 | 3 | | | | | | |
| 10 | 3 | | | | | | |
| 11 | 3 | | | ▒ | | | ▒ |
| 12 | 3 | | | ▒ | | | ▒ |
| 13 | 3 | | | ▒ | | | ▒ |
| 14 | 3 | | | ▓ | | | ▓ |
| 15 | 3 | | | ▓ | | | ▓ |
| 16 | 3 | | | ▓ | | | ▓ |
| 17 | 3 | | | ▓ | | | ▓ |
| 18 | 0 | ■ | ■ | ■ | ■ | ■ | ■ |
| 19 | 0 | ■ | ■ | ■ | ■ | ■ | ■ |
| 20 | 0 | ■ | ■ | ■ | ■ | ■ | ■ |
| 21 | 0 | ■ | ■ | ■ | ■ | ■ | ■ |

■ Inactive Page 315
☐ Active Page 320
▒ Extended Weak Wordline Page 325
▓ Weak Wordline Page 330

SKIPPING PAGES FOR WEAK WORDLINES OF A MEMORY DEVICE DURING PRE-PROGRAMMING

CROSS REFERENCE

The present application for patent claims priority to U.S. Provisional Patent Application No. 63/181,846 by Ang et al., entitled "SKIPPING PAGES FOR WEAK WORDLINES OF A MEMORY DEVICE DURING PREPROGRAMMING", filed Apr. 29, 2021, assigned to the assignee hereof, and expressly incorporated by reference in its entirety herein.

FIELD OF TECHNOLOGY

The following relates generally to one or more systems for memory and more specifically to skipping pages for weak wordlines of a memory device during pre-programming.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

BRIEF DESCRIPTION OF THE DRAWINGS

FIG. 3 illustrates an example of a page map that supports skipping pages for weak wordlines of a memory device during pre-programming in accordance with examples as disclosed herein.

DETAILED DESCRIPTION

Figure 1:
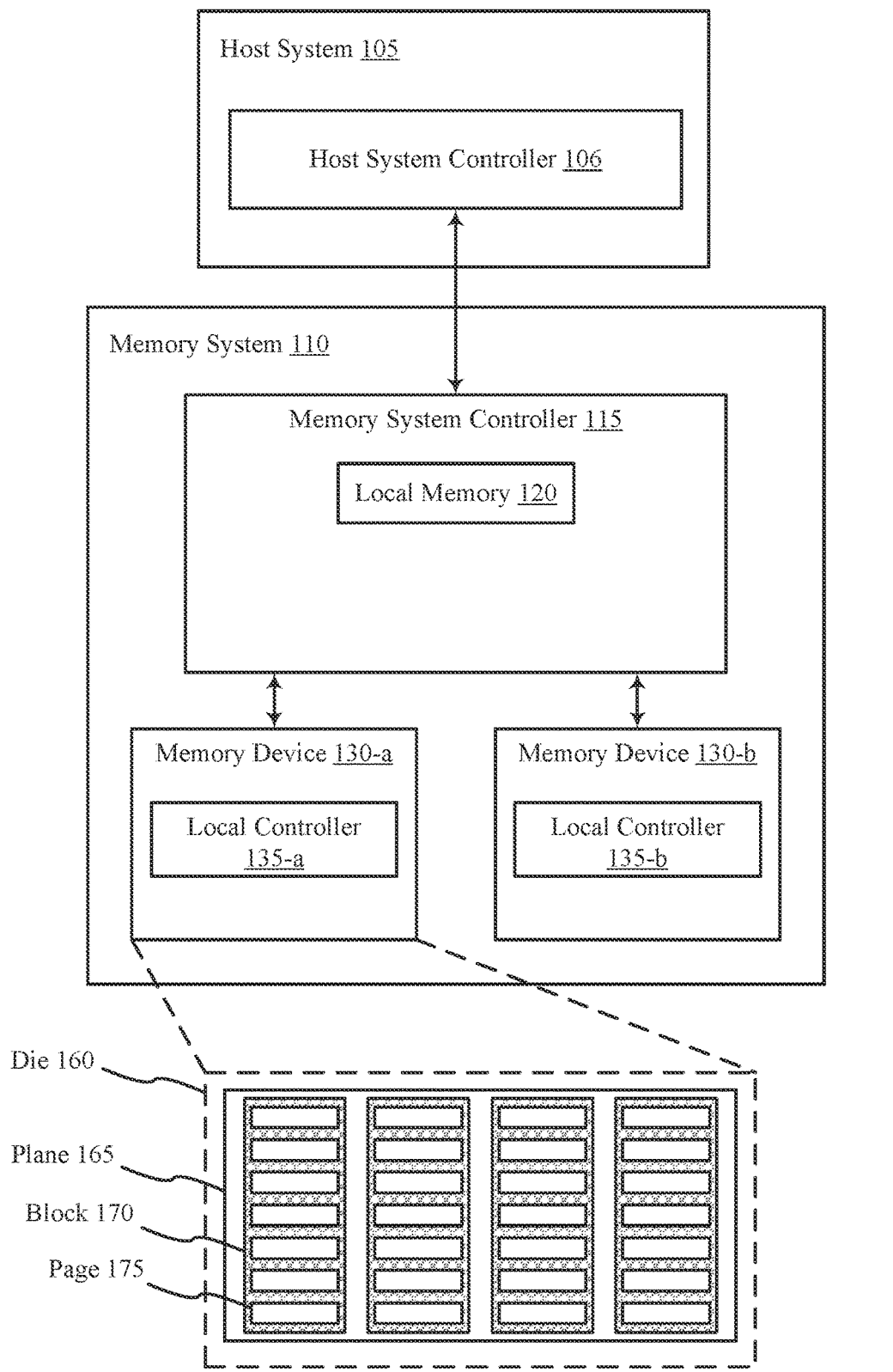
FIGS. 1 and 2 illustrate examples of systems that support skipping pages for weak wordlines of a memory device during pre-programming in accordance with examples as disclosed herein.

In some systems, exposing a memory system to relatively high temperatures may result in altered operating characteristics of one or more components of the memory system. For example, mounting a memory device on (or within) a memory system may involve subjecting the memory device to high temperatures (e.g., at least a threshold temperature due to the application of reflow) that may damage memory cells within the memory device. Such damage may include shifting operating characteristics (e.g., cross-temperature (X-Temp) behavior), decreasing a read window budget (RWB), or other changes associated with memory cell degradation. In some cases, prior to mounting, the memory device may be pre-programmed with data. Exposing the memory device to relatively high temperatures (e.g., at least the threshold temperature) while pre-programmed may result in more damage to the memory cells as compared to exposing the memory device to relatively high temperatures while in an erased state. In some cases, the higher the programming voltage of a memory cell, the more damage the memory cell may experience. Thus, mounting a pre-programmed memory device with relatively high programming voltages (e.g., above a voltage threshold) may cause enough damage that the memory device may fail to satisfy a reliability threshold (e.g., a threshold associated with acceptable memory device operation). A memory device failing the reliability threshold may experience an increased probability of bit errors, a diminished lifetime of the memory device, or both.

Systems, devices, and techniques are described to provide for a pre-programming mode that may allow a memory device to be pre-programmed with data using relatively lower programming voltages. In some examples, testing may be performed to identify one or more portions of a memory device that are more susceptible to damage from relatively high temperatures—such as temperatures experienced during mounting of the memory device—than other portions of the memory device. For example, an RWB measurement may be performed on one or more wordlines of the memory device. If the RWB measurement for a wordline fails to satisfy a threshold value after subjecting the memory device to at least a threshold temperature, the wordline may be considered a "weak wordline." The indices of identified weak wordlines for one memory device may correspond to the indices of weak wordlines for another memory device. As such, a memory device (e.g., different from the test memory device) may be configured with a pre-programming mode that, if activated, may allow the memory device to be pre-programmed with a lower programming voltage threshold (e.g., a lower maximum programming voltage) for the weak wordlines. Specifically, the pre-programming mode may allow the memory device to skip one or more pages if programming weak wordlines. For example, a state of the lower page (LP) of a wordline (or any page corresponding to a least significant bit (LSB) in the gray code for the memory device) may be associated with a relatively high voltage range. In such an example, the pre-programming mode may configure the memory device to skip the LP of each weak wordline, such that the memory device pre-programs the weak wordlines with relatively lower programming voltages.

In some examples, after pre-programming the memory device, the memory device may deactivate the pre-programming mode and may switch to a "normal operating mode." After switching to the normal operating mode, the memory device may cease to skip pages if operating on the weak wordlines. Utilizing the pre-programming mode may result in relatively less damage to memory devices pre-programmed with data during mounting (e.g., as compared to memory devices storing data in each page of the weak wordlines), effectively reducing the alteration of operating characteristics for the memory device, preserving the lifetime of the memory device, and allowing the memory device to satisfy the reliability threshold.

Figure 2:
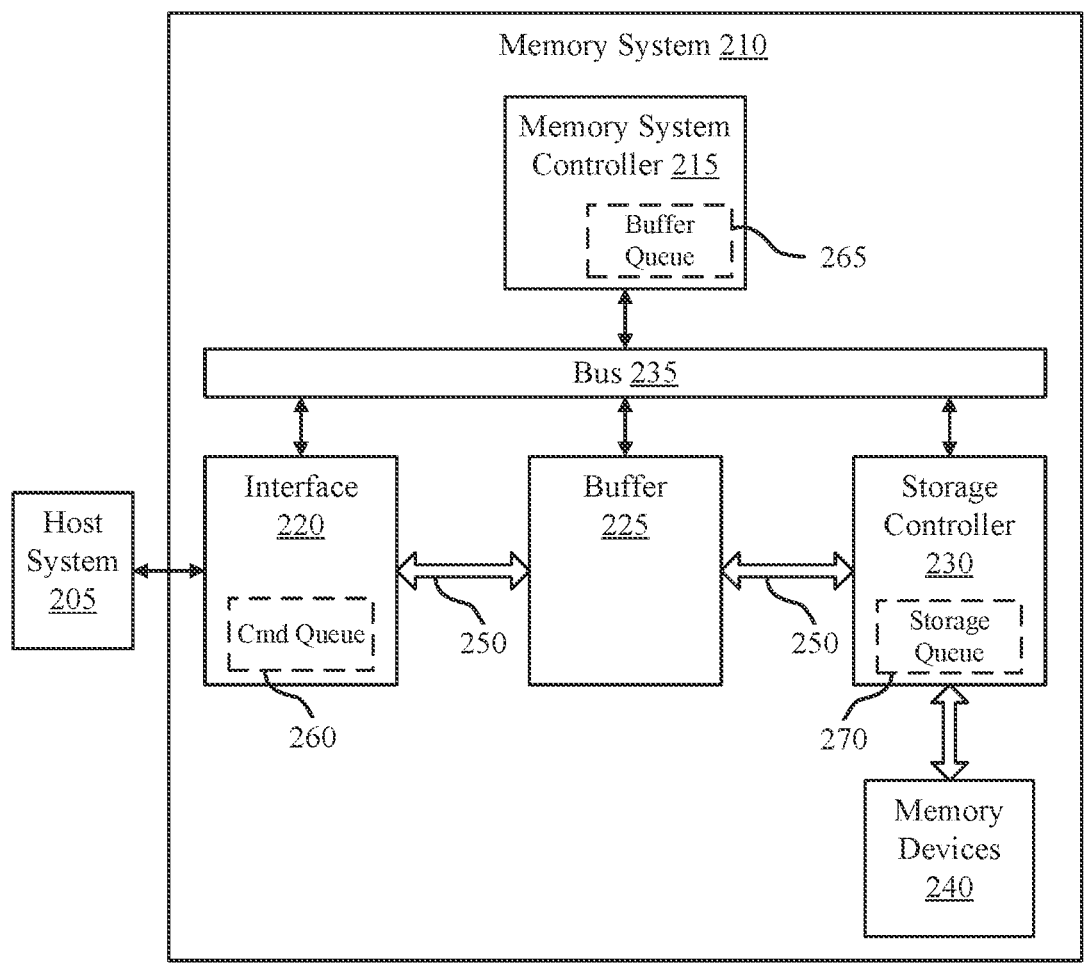

Features of the disclosure are initially described in the context of systems and devices with reference to FIGS. 1 and 2. Features of the disclosure are described in the context of a page map and voltage state diagram with reference to FIGS. 3 and 4. These and other features of the disclosure are further illustrated by and described in the context of a process flow, apparatus diagrams, and flowcharts that relate to skipping pages for weak wordlines of a memory device during pre-programming with reference to FIGS. 5 through 9.

FIG. 1 illustrates an example of a system 100 that supports skipping pages for weak wordlines of a memory device during pre-programming in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common wordline, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support skipping pages for weak wordlines of a memory device during pre-programming. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is an MNAND system.

In some examples, mounting a memory device 130 on (or within) a memory system 110 may involve subjecting the memory device 130 to relatively high temperatures (e.g., above at least a threshold temperature). For example, soldering a memory module (e.g., including one or more pre-packaged memory devices 130) to a printed circuit board (PCB) (e.g., which may include or be an example of a memory system 110) in a reflow soldering process may involve applying the relatively high temperature to (or near) a memory device 130 to form a connection between the memory device 130 and the memory system 110 (e.g., the PCB). In some cases, the relatively high temperature may damage memory cells within the memory device 130, such as those within a page 175, a block 170, a plane 165, a die 160, or any such scope. This damage may include shifting operating characteristics, decreasing an RWB, or other changes associated with memory cell degradation. In some cases, prior to mounting, the memory device 130 may be pre-programmed with data. The higher the programming voltage of a memory cell, the more damage the memory cell may experience. Thus, mounting a pre-programmed memory device 130 with relatively high programming voltages (e.g., above a voltage threshold) may cause an amount of damage such that the memory device 130 may fail to satisfy a reliability threshold (e.g., a threshold associated with memory device operation). The damage may increase the probability of bit errors at the memory device 130, diminish the lifetime of the memory device 130, or both.

In some examples, testing may be performed to identify one or more relatively damaged (or weak) portions of the memory device 130 in response to the application of a relatively high temperature (e.g., at least a threshold temperature for at least a threshold duration). For example, a measurement may be performed on one or more wordlines of the memory device 130. If the measurement for a wordline fails to satisfy a threshold value, the wordline may be considered a "weak wordline". The weak wordlines for one memory device 130 (e.g., the index values for these wordlines) may correspond to weak wordlines at other memory devices 130 (e.g., the wordlines with the same index values may be assumed to be similarly weak). After identifying the one or more weak wordlines for a set of memory devices 130, a memory device 130 of the set may be programmed with a pre-programming mode that, if activated, may configure the memory device 130 to pre-program data using relatively lower programming voltages at the weak wordlines. Specifically, the pre-programming mode may configure the memory device 130 to skip one or more pages if programming weak wordlines. In some examples, after pre-programming the memory device 130, the memory device 130 may deactivate the pre-programming mode and may switch to a "normal operating mode." For example, the mode switch may be triggered by completing a reflow soldering process or by a command. After switching to the normal operating mode, the memory device 130 may cease to skip pages if operating on the weak wordlines. Utilizing the pre-programming mode may result in relatively less damage to memory devices 130 during mounting (e.g., as compared to memory devices storing data in each page of the weak wordlines), effectively reducing the alteration of operating characteristics, preserving the lifetime of the memory device 130, and causing the memory device 130 to satisfy the reliability threshold.

FIG. 2 illustrates an example of a system 200 that supports skipping pages for weak wordlines of a memory device during pre-programming in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received in accordance with the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, if the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some cases, one or more components of the memory system 210 may undergo assembly processes (e.g., manufacturing operations during installation, mounting, soldering on a board) associated with high temperatures. For example, the memory devices 240 (e.g., NAND dies) may be packaged with (e.g., stacked upon, coupled with, or any method of packaging with) an MNAND die and mounted on (or within) the memory system 210. The memory devices 240 may be mounted on (or within) a PCB associated with the memory system 210, mounted on (or within) the memory system 210 itself, or by any other means of mounting the memory devices 240 with the memory system 210. The mounting process may include the application of reflow (e.g., infrared (IR) reflow, such as 3×IR reflow) to solder a memory device 240 to the PCB (e.g., the memory system 210). The memory device 240, the memory system 210, or both may be subjected to a temperature profile by the IR reflow, where different components (e.g., different wordlines) of the memory device 240, the memory system 210, or both may experience different temperature levels (e.g., relatively high temperatures above a threshold temperature) in response to the reflow. The reflow may result in both a physical and electrical coupling between the memory device 240 and the memory system 210.

Prior to assembly processes (e.g., mounting of a memory module including one or more memory devices 240 to a PCB), one or more components of the memory system 210 may be pre-programmed with data. For example, a memory device 240 may be pre-programmed with a specific set of data (e.g., an amount of data that satisfies a threshold value, an amount of data associated with a pre-programming density) before mounting. Pre-programming a memory device 240 with data may involve storing data at one or more memory cells of the memory device 240 prior to mounting the memory device 240 on a PCB. However, exposing pre-programmed memory cells to relatively high temperatures (e.g., temperatures associated with assembly processes, such as reflow) may potentially result in a significant amount of damage to the memory cells.

In some cases, a temperature associated with an assembly process may satisfy a threshold temperature associated with damaging memory cells. For example, soldering a memory device 240 to a memory system 210 may expose the memory device 240 to a temperature that may cause significant damage to one or more memory cells within the memory device 240. Exposure to such temperatures may alter one or more operating characteristics of the memory cells, in some cases rendering the function of the memory cells unreliable. In some examples, these alterations may cause the memory device 240 to fail a reliability threshold. For example, exposing the memory cells to high temperatures (e.g., at least above a threshold temperature) may alter memory cell voltage characteristics to an extent that the memory device 240 fails to operate in a reliable manner (e.g., due to significant state width degradation, programming voltage shift, RWB shift, X-Temp performance degradation, or other alterations associated with memory cell degradation). In some cases, exposing pre-programmed memory cells to relatively high temperatures may result in more damage as compared to exposing erased memory cells to the high temperatures. The higher the voltage stored at a memory cell (e.g., the higher the voltage (VT) set by electron injection at the memory cell), the more damage the memory cell may experience if exposed to relatively high temperatures. Thus, pre-programming a memory device 240 with high voltages (e.g., above a threshold voltage) prior to performing assembly processes may result in significant damage to the memory device 240, higher state width degradation, an increase in raw bit error rates (RBERs) (e.g., at different operating temperatures), diminished lifetime of the memory device 240, or a combination thereof.

In some examples, the system 200 may support a pre-programming mode that, if activated, may allow the memory device 240 to pre-program memory cells with lower programming voltages. That is, the memory device 240 may include logic configured to switch the memory device 240 into and out of the pre-programming mode. In some cases, the logic may switch the operating mode of the memory device 240 in response to a trigger condition (e.g., a command to activate or deactivate the pre-programming mode). Activation of the pre-programming mode may enable the memory device 240 (or a controller of the memory device 240) to skip, or avoid, one or more pages (e.g., LPs, upper pages (UPs), extra pages (XPs), or any other pages) if performing read operations, write operations, or both for specific wordlines. Such wordlines may be referred to as "weak wordlines." Weak wordlines may be wordlines of the memory device 240 that may fail to satisfy one or more quality measurements (e.g., if subjected to at least a threshold temperature). For example, a weak wordline may have the same index as a wordline that, if tested at a threshold temperature, results in an RWB that is less than or equal to an RWB threshold. Identifying weak wordlines is described in more detail with reference to FIG. 3.

As part of a pre-programming process, the memory device 240 may receive a command to activate the pre-programming mode. The memory device 240 may receive a command to perform one or more pre-programming operations (e.g., read operations, write operations, or both) on a quantity of memory cells while operating in the pre-programming mode. Activating the pre-programming mode may enable the memory device 240 to avoid higher voltages while performing such operations on the weak wordlines. In some examples, in order to avoid higher voltages, the memory device 240 may employ a pre-programming scheme that may skip one or more pages associated with a relatively high voltage range.

Specifically, the pre-programming scheme may be associated with a gray code sequence that may allow the memory device 240 to skip one or more bits associated with a relatively high voltage range. By way of example, the memory device 240 may include one or more TLCs, where each memory cell in the memory device 240 may store three bits of data, and each bit of data may be included in a respective page. For example, the memory cell may include a set of wordlines each corresponding to a respective set of at least three pages (e.g., a UP, an LP, and an XP). Each wordline may be coupled with a respective set of memory cells, each memory cell operable to store at least three bits of information (e.g., for a TLC memory cell). Each of the three bits may be included in a respective page of the respective set of at least three pages. In some examples, the most significant bit (MSB) may be included in an XP, the middle bit may be included in a UP, and the LSB may be included in an LP (e.g., according to the gray code). In some such examples, a logic state of the LP of a memory cell in the memory device 240 may be associated with a relatively high voltage range (e.g., ranging from approximately 2.5 volts to 5 volts). In other words, the LP of the memory cell may have a first logic state (e.g., 1) at a relatively low voltage (e.g., 0 to 2.5 volts) and may have a second logic state (e.g., 0) at a relatively high voltage (e.g., 2.5 to 5 volts). As such, the memory device 240 may use a specific gray code sequence to avoid using the LP of the memory cell if the pre-programming mode has been activated. An exemplary gray code sequence associated with pre-programming a TLC device, in order of increasing voltage, may be as follows: 111, 011, 001, 101, 100, 000, 010, 110. As shown, the first four states of the gray code sequence have an LSB of "1." Such a gray code sequence may allow the memory device 240 to skip the LP of the memory cell during the first four logic states, allowing the memory device 240 to avoid higher voltages if pre-programming the memory cell. Similar gray code sequences may be generated and programmed to memory devices 240 that may be examples of SLCs, MLCs, QLCs, or any other level memory cell. Similar gray code sequences may be used to skip one or more pages if programming a memory cell. That is, the gray code sequence for SLCs, MLCs, QLCs, or any other level cell may have a sequence of logic states that avoid flipping a bit associated with a particular page. For example, memory device 240 may be an example of a QLC device and may use a gray code sequence to skip the LP, a UP, or any other page, if pre-programming data to the memory device 240.

Further, the pre-programming scheme may include skipping one or more pages of wordlines proximal to the weak wordlines. That is, the pre-programming scheme may extend page skipping (e.g., LP skipping) to wordlines relatively close (e.g., contiguous) to the weak wordlines. For example, the weak wordlines may be indexed 31 to 42. The pre-programming scheme may include skipping one or more pages of wordlines indexed 28 to 43. In some examples, the wordlines (e.g., the wordlines indexed 28, 29, 30, and 43) proximal to the weak wordlines may also be damaged from assembly processes or may be included with the weak wordlines as a buffer region. In some examples, such additional wordlines included in the skipping scheme may satisfy the one or more quality measurements which the weak wordlines fail to satisfy. However, skipping one or more pages if pre-programming the additional wordlines may further mitigate the damage done to the memory device 240 during assembly processes (e.g., reflow).

The pre-programming scheme may balance the amount of data programmed to the memory device 240 with satisfying the reliability threshold. As described herein, pre-programming the memory device 240 may include programming the memory device 240 with a specific amount of data (e.g., a threshold capacity, such as 90% of the total memory device capacity) before mounting. In some examples, a quantity of wordlines chosen for page skipping may allow the pre-programming of the memory device 240 to satisfy both the threshold capacity prior to reflow and the reliability threshold after reflow. In other words, the quantity of wordlines chosen for page skipping may allow the memory device 240 to store data with a sufficient density while mitigating damage to the memory device 240 (e.g., during the mounting process).

In some examples, the memory device 240 may receive a command to deactivate the pre-programming mode. For example, the memory device 240 may receive a command to operate normally (e.g., not in the pre-programming mode) and, in response to receiving the command, the memory device 240 may perform operations on the weak wordlines without avoiding relatively high voltages. That is, after receiving the command to deactivate the pre-programming mode, the memory device 240 may switch to a normal operating mode and may cease to use the pre-programming scheme (e.g., page skipping). If the memory device 240 receives one or more write commands associated with a set of data, the memory device 240 may store the data at the weak wordlines using any quantity of pages, which may involve using a programming voltage in a relatively high voltage range (e.g., ranging from approximately 2.5 volts to 5 volts). Due to the memory device 240 deactivating the pre-programming mode, the memory device 240 may store the data associated with the one or more write commands using each page of the weak wordlines.

Performing assembly procedures, such as mounting, with a pre-programmed memory device 240 that has been pre-programmed with the techniques described herein may mitigate damage to the memory cells in the memory device 240. That is, utilizing the pre-programming mode may reduce cell degradation (e.g., of the weak (or damaged) wordlines) during a reflow soldering process, reducing alterations of operating characteristics, providing a better RWB margin, and satisfying both the threshold capacity before the reflow soldering process and the reliability threshold after the reflow soldering process for the memory device 240.

FIG. 3 illustrates an example of a page map 300 that supports skipping pages for weak wordlines of a memory device during pre-programming in accordance with examples as disclosed herein. The page map 300 may represent testing results of a memory device. The page map 300 may illustrate the testing results for one or more wordlines in both a first sub-block 305 and a second sub-block 310 of the memory device. In some examples (e.g., as illustrated in FIG. 3), the memory device may be a TLC device. However, a memory device with any quantity of levels may be used to apply the techniques described herein. The page map 300 may implement aspects of a system 100 or a system 200 as described with reference to FIGS. 1 and 2. For example, the testing results of the page map 300 may provide a metric to identify weak wordlines, damaged wordlines, or both in a memory device, such as a memory device 130 or a memory device 240. Upon identifying the weak wordlines, one or more memory devices may be configured to enable a pre-programming mode as described with reference to FIG. 2.

In some examples, a memory device may include one or more dummy wordlines (e.g., wordlines indexed 0, 1, and 18 through 21), where each page of a dummy wordline is an inactive page 315. That is, in some cases, the memory device may not read or write data to the inactive pages 315 of the dummy wordlines. In some examples, the memory device may have wordlines programmed with levels less than or equal to the nominal level of the memory device. For example, although the memory device may be an example of a TLC device supporting storage of up to three bits of data per memory cell, wordline 2 may have inactive pages 315 corresponding to the XP and the UP of each memory cell, enabling the memory cells of the wordline 2 to store one bit of data. Similarly, wordline 3 may have an inactive XP, enabling the memory cells of wordline 3 to store up to two bits of data.

A pre-programming mode may configure a memory device for page skipping. The pre-programming mode may depend on testing of a memory device. Testing may include performing one or more quality measurements on the wordlines of the memory device after pre-programming and exposing the memory device to a threshold temperature. For example, a first memory device may be pre-programmed with an amount of data (e.g., associated with a capacity threshold) and, for a time period, the first memory device may be subjected to at least a threshold temperature (e.g., associated with assembly procedures). In some cases, the first memory device may be subjected to the threshold temperature by performing a reflow soldering process on the first memory device.

An RWB measurement may be performed—for example, by a testing system—on one or more wordlines of the first memory device following application of the threshold temperature. An RWB may correspond to a cumulative value (e.g., voltage) of a quantity of distances between adjacent threshold voltage distributions at a specific bit error rate (BER) for a memory cell. In some examples, the RWB measurement for a wordline may satisfy an RWB threshold such that the pages of the wordline may be active pages 320. For example, the RWB measurement for wordline 4 may be greater than the RWB threshold such that the XP, the UP, and the LP may be active pages 320 if a memory device enables the pre-programming mode. An RWB satisfying (e.g., exceeding) the RWB threshold may indicate threshold voltages that are different enough (e.g., by a significant margin) to support reliable determination of a bit value from the corresponding programmed voltage. In some other examples, the RWB measurement for a wordline may fail to satisfy the RWB threshold (e.g., indicating wordlines associated with performance degradation). For example, the RWB measurement for wordline 15 may be less than or equal to the RWB threshold, making the wordline 15 a "weak" wordline (e.g., relatively unreliable if subjected to the threshold temperature). Accordingly, if the pre-programming mode is enabled, the memory device may skip a weak wordline page 330 (e.g., the LP) of the wordline 15 if performing pre-programming operations (e.g., read operations, write operations, or other access operations while operating in the pre-programming mode). In yet other examples, even though the RWB measurement for a wordline may satisfy the RWB threshold, the wordline may still have been significantly damaged, e.g., due to the temperature from mounting. For example, the RWB measurement for wordline 11 may be greater than the RWB threshold. However, the RWB measurement for the wordline 11 may be substantially close to the RWB threshold, and the memory device may meet a capacity threshold without storing data in a page of the wordline 11. As such, if the pre-programming mode is enabled, the memory device may skip the extended weak wordline page 325 (e.g., the LP) of the wordline 11 if performing pre-programming operations. In some examples, the additional wordlines selected for skipping procedures may border the weak wordlines. That is, in some cases, the additional (e.g., damaged) wordlines may be contiguous with the weak wordlines. Although described in terms of performing RWB measurements, weak wordlines and additional wordlines configured for skipping may be identified using RWB measurements (e.g., failing to satisfy an RWB threshold), reliability measurements (e.g., failing to satisfy a reliability threshold), or any other measurement associated with memory device degradation.

Although not shown, in some cases, the blocks of the memory device may not behave symmetrically. In other words, the index for a weak wordline in the sub-block 305 may be the index for a regular wordline (e.g., a wordline that satisfies the RWB threshold) in the sub-block 310. For example, wordline 16 may be a weak wordline in the sub-block 305, whereas, wordline 16 may be a regular wordline in the sub-block 310.

A second memory device may be configured to operate in accordance with the results of testing the first memory device. For example, the second memory device may be configured to operate in a first mode (e.g., a mode associated with page skipping, such as the pre-programming mode) that may enable the second memory device to skip one or more pages (e.g., the LPs) of a first set of wordlines (e.g., the weak wordlines) and a second set of wordlines (e.g., the extended weak wordlines). While operating in the first mode, the second memory device may store data (e.g., pre-programmed data) in the active pages 320 and may skip (e.g., refrain from) storing data in the inactive pages 315, the weak wordline pages 330, and the extended weak wordline pages 325. The active pages 320 may satisfy a threshold capacity (e.g., 90% storage density) for pre-programming the memory device. Further, the second memory device may be configured to switch from the first mode to a second mode (e.g., a mode associated with normal operation) upon being mounted to a memory system.

Figure 4:
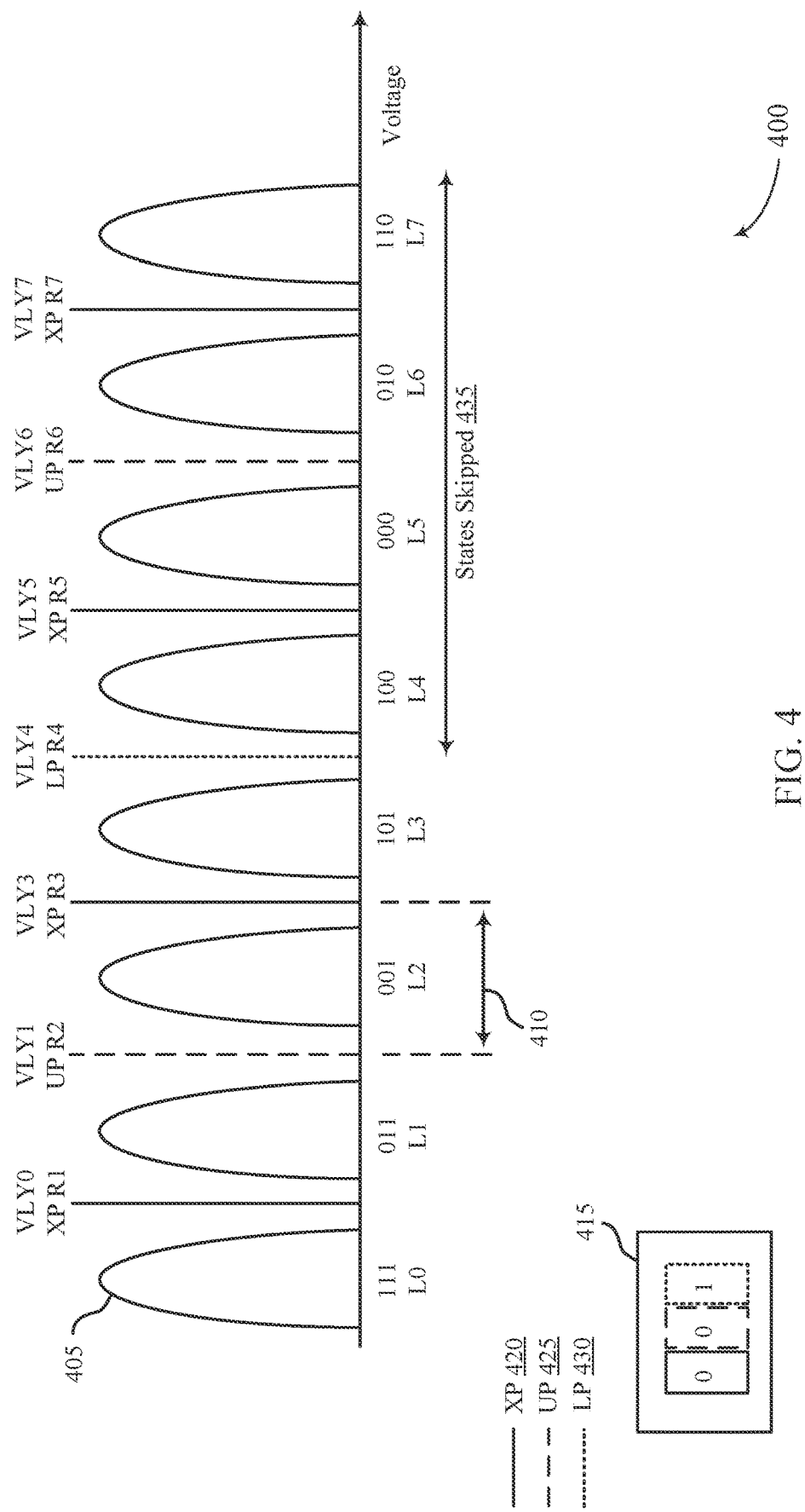
FIG. 4 illustrates an example of a voltage state diagram that supports skipping pages for weak wordlines of a memory device during pre-programming in accordance with examples as disclosed herein.

FIG. 4 illustrates an example of a voltage state diagram 400 that supports skipping pages for weak wordlines of a memory device during pre-programming in accordance with examples as disclosed herein. The voltage state diagram 400 may represent the voltage states of a memory cell in a TLC device, matching each memory cell voltage to a three bit logic state. The voltage state diagram 400 may be associated with a gray code sequence that defines the mapping from a voltage value or range to a logic state. A memory device may skip, or avoid, one or more pages according to the gray code sequence if performing pre-programming operations on weak wordlines. FIG. 4 may not be shown to scale to allow for clearer illustration and description; voltage curves 405 and state widths 410 may be relatively smaller (or larger) than shown. The voltage state diagram 400 may implement aspects of a system 100 or a system 200 as described with reference to FIGS. 1 and 2. For example, a memory device, such as a memory device 130 or a memory device 240, may use voltages according to the voltage state diagram 400. Upon activating a pre-programming mode, the memory device may skip one or more pages if pre-programming specific wordlines (e.g., weak wordlines, as described herein). Further, the voltage state diagram 400 may implement aspects of the page map 300 as described with reference to FIG. 3. For example, the voltage state diagram 400 may enable a memory device to skip the LP of weak wordlines and extended weak wordlines identified using page map 300. By skipping the LP (e.g., as opposed to the UP or XP), the memory device may effectively reduce a threshold voltage (e.g., a maximum programming voltage for the weak wordlines) by half according to the voltage state diagram 400 due to the four lowest voltage thresholds corresponding to the same LP value.

In some cases, each bit for a logic state may correspond to a particular page. For example, exemplary logic state 415 shows the page division of a three bit logic state, with the XP 420 storing a 0 value, the UP 425 storing a 0 value, and the LP 430 storing a 1 value. In this case, the MSB may correspond to an XP 420 of a memory cell, the middle bit may correspond to a UP 425 of the memory cell, and the LSB may correspond to an LP 430 of the memory cell.

Increasing the voltage of the memory cell past a threshold may flip a bit of the logic state. For example, the memory cell may have a logic state of 111, corresponding to level 0 (L0) in the voltage state diagram 400. The memory device may increase the voltage of the memory cell (e.g., as part of a pre-programming operation), in some cases, past a threshold voltage (e.g., VLY0). In the example of voltage state diagram 400, exceeding the voltage of the memory cell beyond the threshold voltage VLY0 may correspond to flipping the MSB of the memory cell. In other words, increasing the voltage of the memory cell past VLY0 may change the state of XP 420 from a logic value of "1" to a logic value of "0."

In some examples, the memory cell may be within a weak wordline or an extended weak wordline. As such, the memory device may skip one or more pages to reduce a threshold (e.g., maximum) programming voltage supported by memory cells coupled to a weak wordline (or an extended weak wordline) according to a gray code sequence for the memory device or the memory cells. In some cases, the gray code sequence for the voltage state diagram 400 may be selected such that a single page (e.g., the LP 430) may correspond to the highest voltage thresholds. The memory device may skip the LP 430 as part of a pre-programming operation as described with reference to FIGS. 1 through 3 to remove the states skipped 435 for the weak wordlines (e.g., including the extended weak wordlines). For example, in the voltage state diagram 400, the gray code sequence may define that the states skipped 435 reduce the maximum threshold programming voltage from VLY7 to VLY3 because the LP 430 is skipped (and, thus, the bit value for the LP 430 is constant, such as a logic value of "1"). That is, during the pre-programming operation, the memory cell coupled with a weak wordline may be programmed with states L0, L1, L2, or L3 and the corresponding threshold voltages VLY0, VLY1, and VLY3 may be associated with changing the XP 420 and the UP 425. In such an example, the memory cell may utilize half the potential voltage states, and thus, half the potential voltage range of the memory cell as part of the pre-programming operation. Thus, using the voltage state diagram 400 may reduce the voltage programmed to the memory cells for the weak wordlines.

Although described in terms of a TLC device, a similar voltage state diagram 400 may be generated for a memory device with any quantity of levels such as an MLC device, a QLC device, or the like. In other words, similar gray code sequences may be generated and programmed to memory devices 240 that may be examples of SLCs, MLCs, QLCs, or any other level cells. The gray code sequence for SLCs, MLCs, QLCs, or any other level cells may have a sequence of logic states that avoid flipping a bit associated with a particular page. For example, a memory device may be an example of a QLC device and may use a gray code sequence to skip the LP, a UP, or any combination of these or other pages if pre-programming data to the memory device.

Lowering the threshold (e.g., maximum) programming voltage for each memory cell coupled to a weak wordline or an extended weak wordline may mitigate damage done to the memory device during assembly processes due to high temperatures. This may extend the lifetime of the device, decrease RBERs, and lessen state width degradation. For example, following a reflow soldering process, the memory device may support a larger RWB margin (e.g., as compared to a memory device with weak wordlines programmed with relatively higher voltages, such as a threshold voltage VLY7). A relatively larger RWB margin may support an X-Temp capability at the memory device, such that the memory device may operate reliably (e.g., above a reliability threshold) across multiple operating temperatures.

Figure 5:
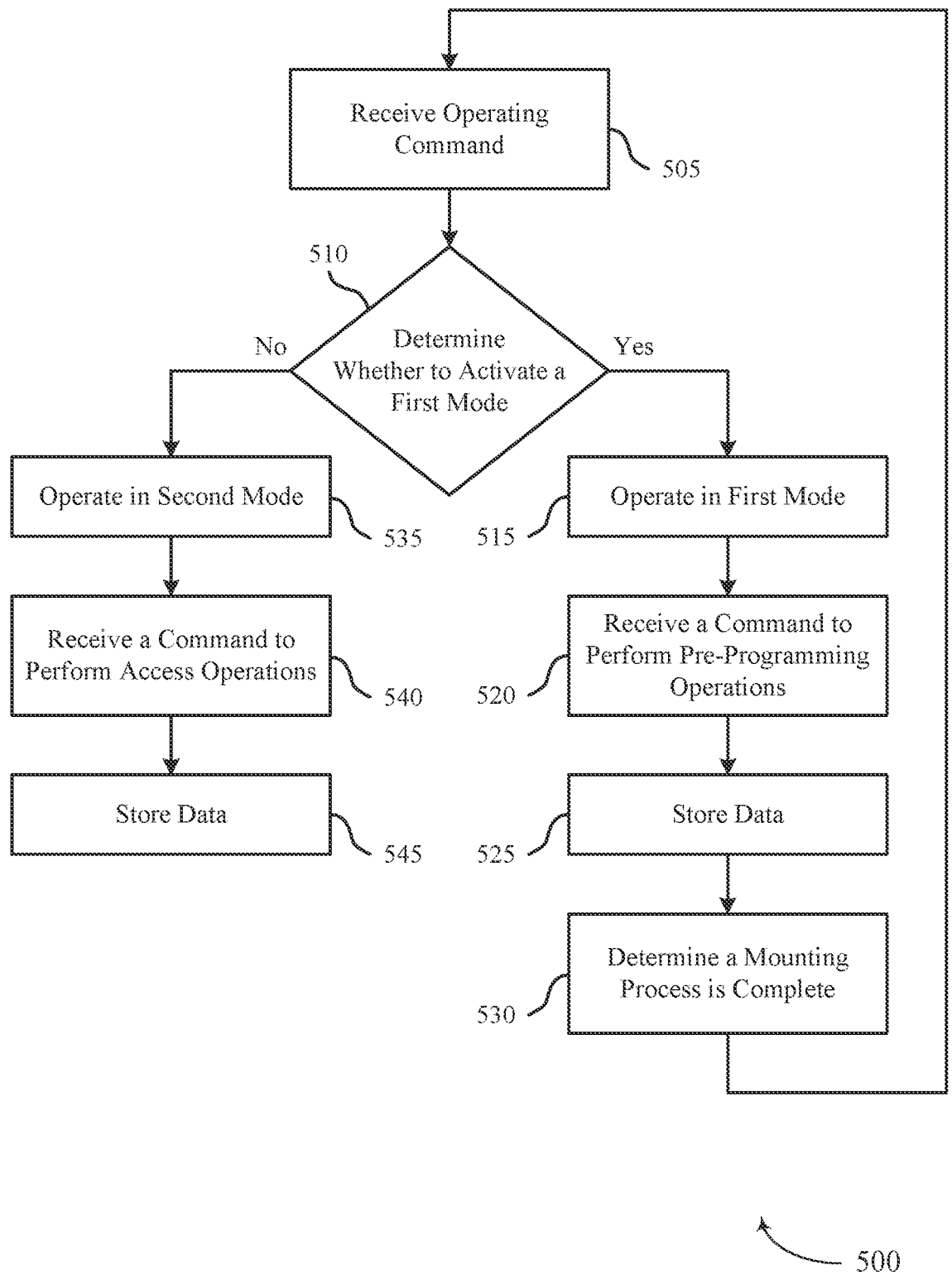
FIG. 5 illustrates an example of a process flow that supports skipping pages for weak wordlines of a memory device during pre-programming in accordance with examples as disclosed herein.

FIG. 5 illustrates an example of a process flow 500 that supports skipping pages for weak wordlines of a memory device during pre-programming in accordance with examples as disclosed herein. The operations of the process flow 500 may be implemented by a memory device or its components as described herein. For example, the operations of the process flow 500 may be performed by a system as described with reference to FIGS. 1 and 2. A memory device may perform operations associated with the process flow 500 to support skipping one or more pages of weak wordlines (e.g., including extended weak wordlines) which may be identified by a testing system according to a page map, such as the page map 300 as described with reference to FIG. 3. Further, the process flow 500 may implement aspects of a voltage state diagram 400 as described with reference to FIG. 4 to implement specific page skipping to reduce threshold programming voltages. Alternative examples of the following may be implemented, where some steps are performed in a different order or not at all. Additionally, some steps may include additional features not mentioned below.

Aspects of the process flow 500 may be implemented by a controller, among other components (e.g., a memory device controller such as an MNAND die of a memory device). Additionally or alternatively, aspects of the process flow 500 may be implemented as instructions stored in memory (e.g., firmware stored in a memory coupled with the memory device). For example, the instructions, if executed by a controller, may cause the controller to perform the operations of the process flow 500.

At 505, an operating command may be received. For example, a memory device may receive an operating command that may, in some cases, be associated with activating a first mode. The first mode may be configured to skip a first subset of pages corresponding to a first set of wordlines of a memory device. That is, the first mode may be an example of the pre-programming mode as described with reference to FIG. 2, and the first set of wordlines may be the weak wordlines (e.g., including the extended weak wordlines) as described herein.

At 510, a decision of whether to activate the first mode may be determined. In some examples, the operating command may be associated with activating the first mode, and as such, the memory device may determine to activate the first mode. Accordingly, at 515, the first mode may be the operating mode. For example, the memory device may switch to the first mode (e.g., the pre-programming mode).

At 520, a command to perform pre-programming operations may be received. For example, the memory device may receive a command instructing the memory device to perform write operations, read operations, or any other access operations associated with pre-programming. The pre-programming operations may be associated with a threshold capacity at the memory device. For example, the pre-programming operations may be write operations, where the memory device may receive a first set of data (e.g., pre-programmed data of a quantity up to the threshold capacity) and perform one or more write operations in accordance with operating in the first mode. That is, the memory device may perform page skipping for the first set of wordlines if performing the one or more write operations as described with reference to FIG. 2. In some examples, the write operations may be addressed to a first subset of wordlines (e.g., weak and extended weak wordlines).

In some examples, each wordline of the first set of wordlines (e.g., a first subset of the total set of wordlines) may be coupled with a respective set of memory cells. Each memory cell may be operable to store at least three bits of information (e.g., for a TLC) and each of the at least three bits may be included in a respective page (e.g., an LP, a UP, an XP, or any page) of a respective set of at least three pages corresponding to the wordline. In the first mode, the memory device may be configured to skip a first subset of pages corresponding to the first subset of wordlines. The first subset of pages may include a respective first page (e.g., the LP) for each wordline (e.g., each weak or extended weak wordline) of the first subset of wordlines. Further, in the first mode, the memory device may be configured to store data in a second subset of pages corresponding to the first subset of wordlines that may include a respective second page (e.g., the UP) for each wordline of the first subset of wordlines, a respective third page (e.g., the XP) for each wordline of the first subset of wordlines, or any combination thereof.

At 525, the first set of data may be stored. For example, the memory device may perform the pre-programming operations upon receiving the command at 520. In some examples, the pre-programming operations may be write operations for a first set of data, and the memory device may store the first set of data in the second set (e.g., subset) of pages. Phrased alternatively, the memory device may skip the first subset of pages (e.g., the LP) of the first subset of wordlines for performing read and write operations while operating in the first mode. Skipping the first subset of pages may reduce a voltage threshold (e.g., a maximum programming voltage) for the first subset of wordlines. The memory device may instead write the first set of data to the second subset of pages (e.g., the UP, the XP, or both) of the first subset of wordlines. Additionally, one or more read commands may be received. For example, the memory device may receive a read command while operating in the first mode. Likewise, the memory device may skip the first subset of pages of the first subset of wordlines as described herein while performing the read operations. The first subset of wordlines may be configured to satisfy a threshold capacity. For example, the quantity of "weak" wordlines for which to skip one or more pages may be determined—for example, by a testing system—such that the memory device supports a threshold capacity (e.g., 90% of the memory device capacity) while operating in the first mode. The first set of data may satisfy (e.g., have a size less than or equal to) the threshold capacity.

The first subset of pages may be skipped according to a gray code mapping from voltage threshold levels for respective sets of memory cells to logical states for the respective sets of memory cells as described with reference to FIG. 4.

At 530, a mounting process may be determined to be complete. For example, the memory device (e.g., one or more memory devices packaged in a memory module) may be mounted on a PCB. In response to determining that the mounting process is complete, the memory device may cease to perform pre-programming operations. For example, at 505, an operating command may be received. That is the memory device may receive a command to switch from the first mode to a second mode (e.g., a "normal" operating mode). Likewise, at 510, a decision of whether to activate a first mode may be determined. In response to receiving the operating command to switch from the first mode to the second mode, the memory device may switch from operating in the first mode to operating in the second mode.

At 535, the operating mode may be the second operating mode. For example, the memory device may refrain from skipping pages if performing access operations. That is, if operating in the second mode, the memory device may be configured to use each page of the first subset of pages (e.g., each page of a memory cell coupled to a weak wordline).

At 540, a command to perform access operations may be received. For example, the memory device may receive a command instructing the memory device to perform write operations, read operations, or any other access operations. In some examples, the command at 540 may be a read command, and the memory device may refrain from skipping the first subset of pages for the read operation in response to the read command and due to operating in the second mode. In some examples, the access operation may be a write operation, where the memory device may receive a second set of data and perform one or more write operations in accordance with operating in the second mode.

If the memory device receives a write command, at 545, the second set of data may be stored. The memory device may store the second set of data in the first subset of pages for the first subset of wordlines due to operating in the second mode. In other words, the memory device may refrain from skipping pages of the memory cells coupled with the first subset of wordlines (e.g., the weak wordlines) if performing access operations.

The memory device may satisfy a threshold reliability while operating in the second mode due to skipping the first subset of pages corresponding to the first subset of wordlines while operating in the first mode. For example, by operating in the first mode for pre-programming data, the memory device may reduce damage caused by the mounting process, mitigating the negative effects of the mounting process on the reliability of the memory device.

Enabling a memory device to switch to a pre-programming mode (e.g., the first mode) that allows the memory device to skip one or more pages if programming weak (or damaged) wordlines may mitigate damage to the memory device during assembly procedures as described with reference to FIG. 2. That is, utilizing the pre-programming mode, prior to mounting, may result in less damage to the memory device while mounting, reducing the alteration of operating characteristics, preserving the lifetime of the memory device, and preserving the threshold capacity at the memory device.

Figure 6:
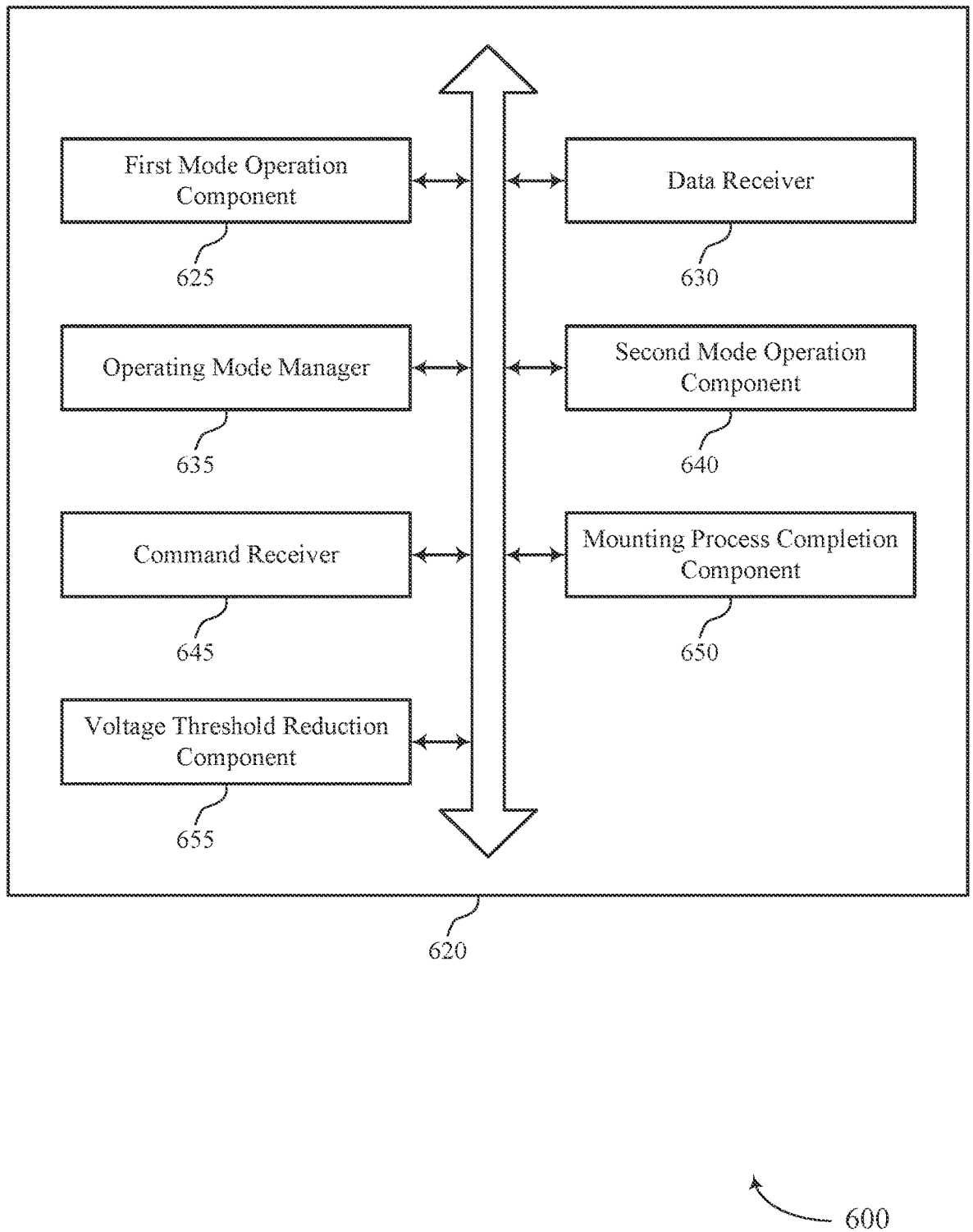
FIG. 6 shows a block diagram of a memory device that supports skipping pages for weak wordlines of the memory device during pre-programming in accordance with examples as disclosed herein.

FIG. 6 shows a block diagram 600 of a memory device 620 that supports skipping pages for weak wordlines of the memory device during pre-programming in accordance with examples as disclosed herein. The memory device 620 may be an example of aspects of a memory device as described with reference to FIGS. 1 through 5. The memory device 620, or various components thereof, may be an example of means for performing various aspects of skipping pages for weak wordlines during pre-programming as described herein. For example, the memory device 620 may include a first mode operation component 625, a data receiver 630, an operating mode manager 635, a second mode operation component 640, a command receiver 645, a mounting process completion component 650, a voltage threshold reduction component 655, or any combination thereof. Each of these components may communicate, directly or indirectly, with one another (e.g., via one or more buses).

The first mode operation component 625 may be configured as or otherwise support a means for operating in a first mode configured to skip a first subset of pages corresponding to a first subset of wordlines of the memory device 620. The data receiver 630 may be configured as or otherwise support a means for receiving a first set of data while operating in the first mode. In some examples, the first mode operation component 625 may be configured as or otherwise support a means for storing the first set of data in a second subset of pages corresponding to the first subset of wordlines in accordance with operating in the first mode, the second subset of pages distinct from the first subset of pages. For example, the second subset of pages may not overlap with the first subset of pages, such that the second subset of pages (e.g., a UP and an XP) supports storing data and the first subset of pages (e.g., an LP) does not support storing data in the first mode. The operating mode manager 635 may be configured as or otherwise support a means for switching, after storing the first set of data and in response to a trigger condition, from operating in the first mode to operating in a second mode configured to use each page of the first subset of pages. In some examples, the data receiver 630 may be configured as or otherwise support a means for receiving a second set of data while operating in the second mode. The second mode operation component 640 may be configured as or otherwise support a means for storing the second set of data in the first subset of pages in accordance with operating in the second mode.

In some examples, the command receiver 645 may be configured as or otherwise support a means for receiving a command to switch from the first mode to the second mode, where the trigger condition includes receiving the command.

In some examples, the mounting process completion component 650 may be configured as or otherwise support a means for determining that a mounting process for the memory device is complete, where the trigger condition includes determining that the mounting process is complete.

In some examples, the command receiver 645 may be configured as or otherwise support a means for receiving a read command while operating in the first mode. In some examples, the first mode operation component 625 may be configured as or otherwise support a means for skipping the first subset of pages for a read operation in response to the read command due to operating in the first mode.

In some examples, the command receiver 645 may be configured as or otherwise support a means for receiving a read command while operating in the second mode. In some examples, the second mode operation component 640 may be configured as or otherwise support a means for refraining from skipping the first subset of pages for a read operation in response to the read command due to operating in the second mode.

In some examples, the first subset of wordlines is configured to satisfy a threshold capacity for the memory device.

In some examples, the voltage threshold reduction component 655 may be configured as or otherwise support a means for reducing a voltage threshold for the first subset of wordlines due to skipping the first subset of pages corresponding to the first subset of wordlines.

In some examples, the memory device satisfies a threshold reliability while operating in the second mode based on (e.g., in response to) skipping the first subset of pages corresponding to the first subset of wordlines while operating in the first mode.

In some examples, each wordline of the first subset of wordlines is coupled with a respective set of memory cells each operable to store at least three bits of information, each of the at least three bits included in a respective page of a respective set of at least three pages corresponding to the wordline. In some examples, the first subset of pages corresponding to the first subset of wordlines includes a respective first page for each wordline of the first subset of wordlines. In some examples, the second subset of pages corresponding to the first subset of wordlines includes a respective second page for each wordline of the first subset of wordlines, a respective third page for each wordline of the first subset of wordlines, or any combination thereof.

In some examples, the first subset of pages is configured based at least in part on a gray code for mapping from voltage threshold levels for the respective sets of memory cells to logical states for the respective sets of memory cells. In some examples, the first set of data includes pre-programmed data for the memory device.

Figure 7:
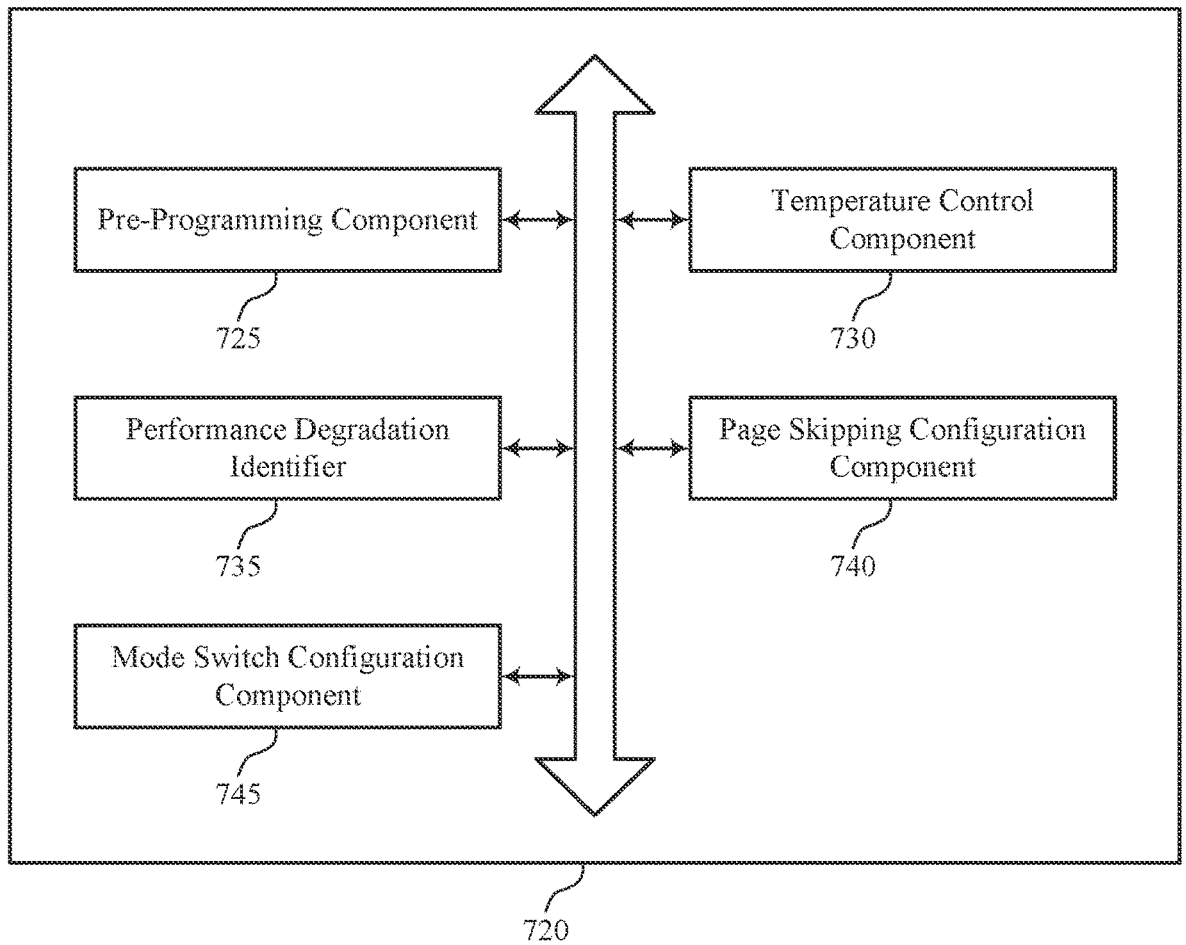
FIG. 7 shows a block diagram of a testing system that supports skipping pages for weak wordlines of a memory device during pre-programming in accordance with examples as disclosed herein.

FIG. 7 shows a block diagram 700 of a testing system 720 that supports skipping pages for weak wordlines of a memory device during pre-programming in accordance with examples as disclosed herein. The testing system 720 may be an example of aspects of a testing system which may perform testing on a memory device as described with reference to FIGS. 1 through 5. The testing system 720, or various components thereof, may be an example of means for performing various aspects of skipping pages for weak wordlines of a memory device during pre-programming as described herein. For example, the testing system 720 may include a pre-programming component 725, a temperature control component 730, a performance degradation identifier 735, a page skipping configuration component 740, a mode switch configuration component 745, or any combination thereof. In some cases, each of these components may communicate, directly or indirectly, with one another (e.g., via one or more buses or other communication links).

The pre-programming component 725 may be configured as or otherwise support a means for pre-programming memory cells coupled with a first set of wordlines within a first memory device to store a set of data. The temperature control component 730 may be configured as or otherwise support a means for subjecting the first memory device, after pre-programming the memory cells, to at least a threshold temperature. The performance degradation identifier 735 may be configured as or otherwise support a means for identifying a subset of wordlines within the first set of wordlines in accordance with a performance degradation for the subset of wordlines resulting from subjecting the first memory device to at least the threshold temperature. The page skipping configuration component 740 may be configured as or otherwise support a means for configuring a second memory device to skip a subset of pages corresponding to a second set of wordlines within the second memory device for read operations and write operations in accordance with a threshold reliability for the second memory device, the second set of wordlines and the subset of wordlines having corresponding wordline indices.

In some examples, the performance degradation identifier 735 may be configured as or otherwise support a means for identifying the subset of pages corresponding to the second set of wordlines in accordance with a threshold capacity for the second memory device.

In some examples, to support configuring, the page skipping configuration component 740 may be configured as or otherwise support a means for configuring the second memory device to operate in a first mode prior to the second memory device being mounted to a memory system, the first mode corresponding to the second memory device skipping the subset of pages corresponding to the second set of wordlines within the second memory device for read operations and write operations.

In some examples, the mode switch configuration component 745 may be configured as or otherwise support a means for configuring the second memory device to switch from the first mode to a second mode in response to the second memory device being mounted to the memory system, the second mode corresponding to the second memory device using the subset of pages corresponding to the second set of wordlines within the second memory device for read operations and write operations.

In some examples, to support identifying the subset of wordlines, the performance degradation identifier 735 may be configured as or otherwise support a means for identifying a first subset of wordlines within the first set of wordlines as satisfying a threshold performance degradation, failing to satisfy a threshold wordline reliability, or both resulting from subjecting the first memory device to at least the threshold temperature. In some examples, to support identifying the subset of wordlines, the performance degradation identifier 735 may be configured as or otherwise support a means for identifying a second subset of wordlines within the first set of wordlines and contiguous to the first subset of wordlines, where the subset of wordlines includes the first subset of wordlines and the second subset of wordlines.

Figure 8:
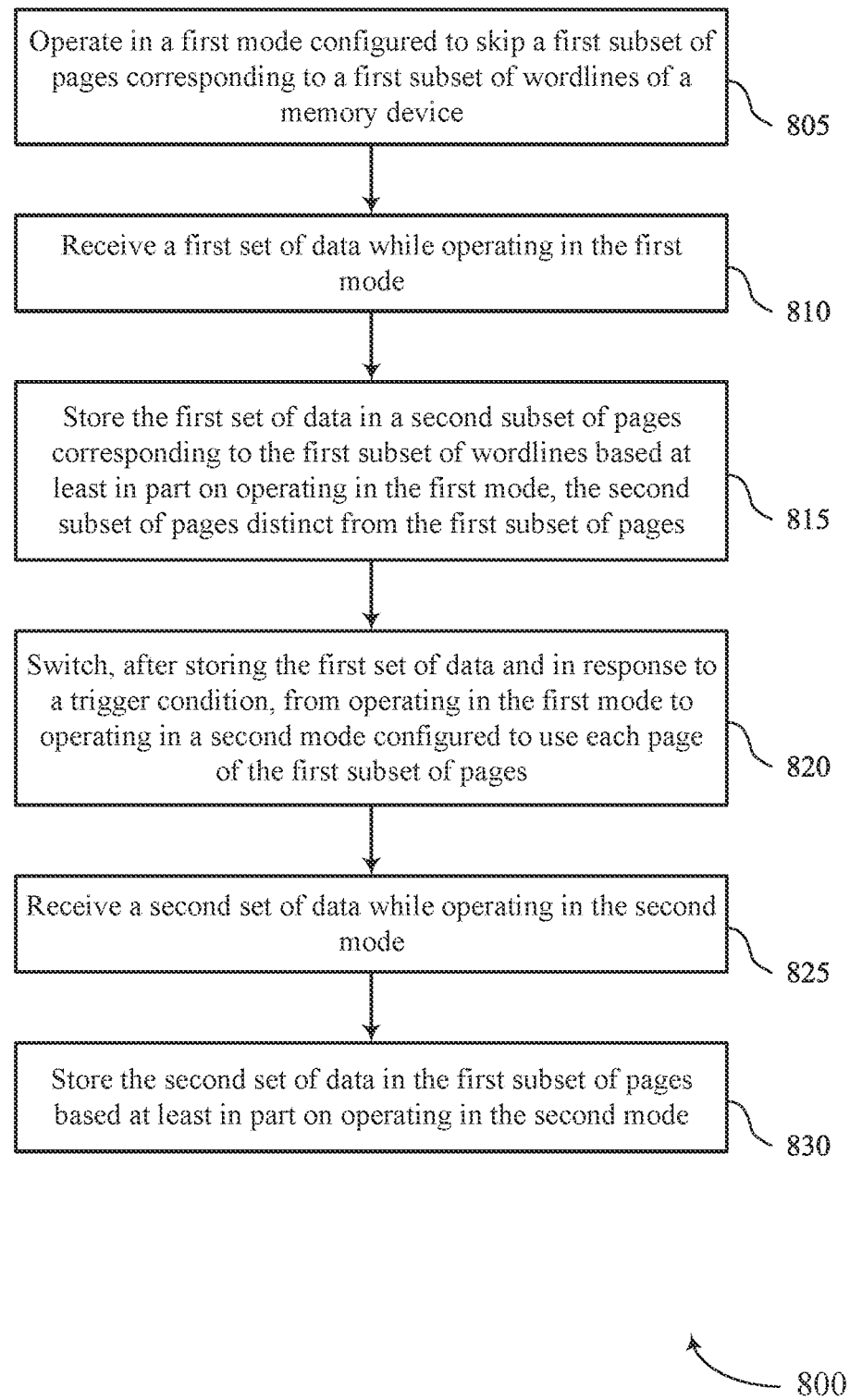
FIGS. 8 and 9 show flowcharts illustrating a method or methods that support skipping pages for weak wordlines of a memory device during pre-programming in accordance with examples as disclosed herein.

FIG. 8 shows a flowchart illustrating a method 800 that supports skipping pages for weak wordlines of a memory device during pre-programming in accordance with examples as disclosed herein. The operations of method 800 may be implemented by a memory device or its components as described herein. For example, the operations of method 800 may be performed by a memory device as described with reference to FIGS. 1 through 6.

In some examples, a memory device may execute a set of instructions to control the functional elements of the device to perform the described functions. Additionally or alternatively, the memory device may perform aspects of the described functions using special-purpose hardware.

At 805, the method may include operating in a first mode configured to skip a first subset of pages corresponding to a first subset of wordlines of a memory device. The operations of 805 may be performed in accordance with examples as disclosed herein. In some examples, aspects of the operations of 805 may be performed by a first mode operation component 625 as described with reference to FIG. 6.

At 810, the method may include receiving a first set of data while operating in the first mode. The operations of 810 may be performed in accordance with examples as disclosed herein. In some examples, aspects of the operations of 810 may be performed by a data receiver 630 as described with reference to FIG. 6.

At 815, the method may include storing the first set of data in a second subset of pages corresponding to the first subset of wordlines in accordance with operating in the first mode, the second subset of pages distinct from the first subset of pages. The operations of 815 may be performed in accordance with examples as disclosed herein. In some examples, aspects of the operations of 815 may be performed by a first mode operation component 625 as described with reference to FIG. 6.

At 820, the method may include switching, after storing the first set of data and in response to a trigger condition, from operating in the first mode to operating in a second mode configured to use each page of the first subset of pages. The operations of 820 may be performed in accordance with examples as disclosed herein. In some examples, aspects of the operations of 820 may be performed by an operating mode manager 635 as described with reference to FIG. 6.

At 825, the method may include receiving a second set of data while operating in the second mode. The operations of 825 may be performed in accordance with examples as disclosed herein. In some examples, aspects of the operations of 825 may be performed by a data receiver 630 as described with reference to FIG. 6.

At 830, the method may include storing the second set of data in the first subset of pages in accordance with operating in the second mode. The operations of 830 may be performed in accordance with examples as disclosed herein. In some examples, aspects of the operations of 830 may be performed by a second mode operation component 640 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for operating in a first mode configured to skip a first subset of pages corresponding to a first subset of wordlines of a memory device, receiving a first set of data while operating in the first mode, storing the first set of data in a second subset of pages corresponding to the first subset of wordlines in accordance with operating in the first mode, the second subset of pages distinct from the first subset of pages, switching, after storing the first set of data and in response to a trigger condition, from operating in the first mode to operating in a second mode configured to use each page of the first subset of pages, receiving a second set of data while operating in the second mode, and storing the second set of data in the first subset of pages in accordance with operating in the second mode.

Some examples of the method 800 and the apparatus described herein may further include operations, features, circuitry, logic, means, or instructions for receiving a command to switch from the first mode to the second mode, where the trigger condition includes receiving the command.

Some examples of the method 800 and the apparatus described herein may further include operations, features, circuitry, logic, means, or instructions for determining that a mounting process for the memory device is complete, where the trigger condition includes determining that the mounting process is complete.

Some examples of the method 800 and the apparatus described herein may further include operations, features, circuitry, logic, means, or instructions for receiving a read command while operating in the first mode and skipping the first subset of pages for a read operation in response to the read command in accordance with operating in the first mode.

Some examples of the method 800 and the apparatus described herein may further include operations, features, circuitry, logic, means, or instructions for receiving a read command while operating in the second mode and refraining from skipping the first subset of pages for a read operation in response to the read command in accordance with operating in the second mode.

In some examples of the method 800 and the apparatus described herein, the first subset of wordlines may be configured to satisfy a threshold capacity for the memory device.

Some examples of the method 800 and the apparatus described herein may further include operations, features, circuitry, logic, means, or instructions for reducing a voltage threshold for the first subset of wordlines due to skipping the first subset of pages corresponding to the first subset of wordlines.

In some examples of the method 800 and the apparatus described herein, the memory device satisfies a threshold reliability while operating in the second mode due to skipping the first subset of pages corresponding to the first subset of wordlines while operating in the first mode.

In some examples of the method 800 and the apparatus described herein, each wordline of the first subset of wordlines may be coupled with a respective set of memory cells each operable to store at least three bits of information, each of the at least three bits included in a respective page of a respective set of at least three pages corresponding to the wordline, the first subset of pages corresponding to the first subset of wordlines includes a respective first page for each wordline of the first subset of wordlines, and the second subset of pages corresponding to the first subset of wordlines includes a respective second page for each wordline of the first subset of wordlines, a respective third page for each wordline of the first subset of wordlines, or any combination thereof.

In some examples of the method 800 and the apparatus described herein, the first subset of pages may be configured based at least in part on a gray code for mapping from voltage threshold levels for the respective sets of memory cells to logical states for the respective sets of memory cells.

In some examples of the method 800 and the apparatus described herein, the first set of data includes pre-programmed data for the memory device.

Figure 9:
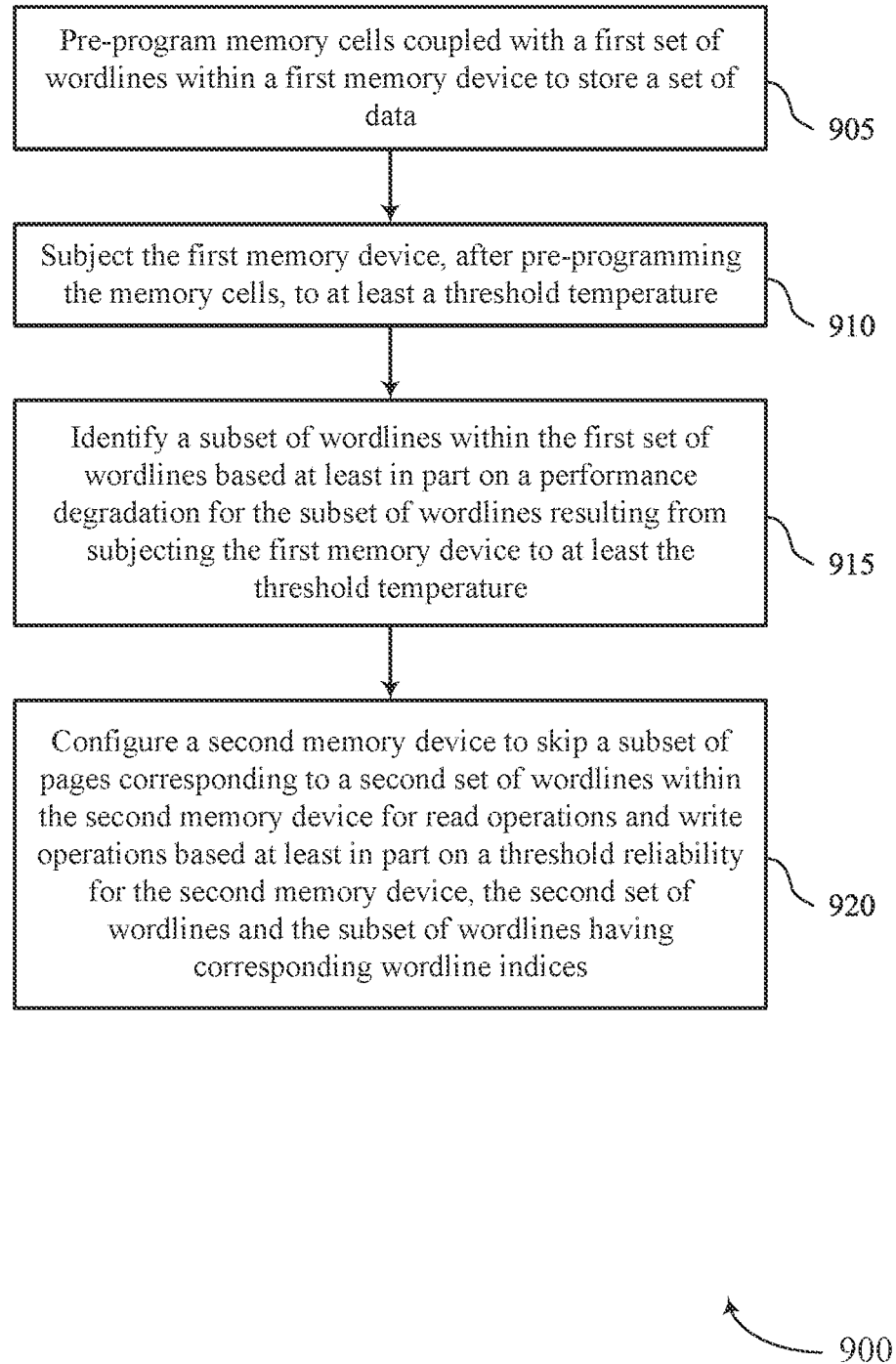

FIG. 9 shows a flowchart illustrating a method 900 that supports skipping pages for weak wordlines of a memory device during pre-programming in accordance with examples as disclosed herein. The operations of method 900 may be implemented by a testing system or its components as described herein. For example, the operations of method 900 may be performed by a testing system as described with reference to FIGS. 1 through 5 and 7. In some examples, a testing system may execute a set of instructions to control the functional elements of the system to perform the described functions. Additionally or alternatively, the testing system may perform aspects of the described functions using special-purpose hardware.

At 905, the method may include pre-programming memory cells coupled with a first set of wordlines within a first memory device to store a set of data. The operations of 905 may be performed in accordance with examples as disclosed herein. In some examples, aspects of the operations of 905 may be performed by a pre-programming component 725 as described with reference to FIG. 7.

At 910, the method may include subjecting the first memory device, after pre-programming the memory cells, to at least a threshold temperature. The operations of 910 may be performed in accordance with examples as disclosed herein. In some examples, aspects of the operations of 910 may be performed by a temperature control component 730 as described with reference to FIG. 7.

At 915, the method may include identifying a subset of wordlines within the first set of wordlines in accordance with a performance degradation for the subset of wordlines resulting from subjecting the first memory device to at least the threshold temperature. The operations of 915 may be performed in accordance with examples as disclosed herein. In some examples, aspects of the operations of 915 may be performed by a performance degradation identifier 735 as described with reference to FIG. 7.

At 920, the method may include configuring a second memory device to skip a subset of pages corresponding to a second set of wordlines within the second memory device for read operations and write operations in accordance with a threshold reliability for the second memory device, the second set of wordlines and the subset of wordlines having corresponding wordline indices. The operations of 920 may be performed in accordance with examples as disclosed herein. In some examples, aspects of the operations of 920 may be performed by a page skipping configuration component 740 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for pre-programming memory cells coupled with a first set of wordlines within a first memory device to store a set of data, subjecting the first memory device, after pre-programming the memory cells, to at least a threshold temperature, identifying a subset of wordlines within the first set of wordlines according to a performance degradation for the subset of wordlines resulting from subjecting the first memory device to at least the threshold temperature, and configuring a second memory device to skip a subset of pages corresponding to a second set of wordlines within the second memory device for read operations and write operations in accordance with a threshold reliability for the second memory device, the second set of wordlines and the subset of wordlines having corresponding wordline indices.

Some examples of the method 900 and the apparatus described herein may further include operations, features, circuitry, logic, means, or instructions for identifying the subset of pages corresponding to the second set of wordlines in accordance with a threshold capacity for the second memory device.

In some examples of the method 900 and the apparatus described herein, operations, features, circuitry, logic, means, or instructions for the configuring may include operations, features, circuitry, logic, means, or instructions for configuring the second memory device to operate in a first mode prior to the second memory device being mounted to a memory system, the first mode corresponding to the second memory device skipping the subset of pages corresponding to the second set of wordlines within the second memory device for read operations and write operations.

Some examples of the method 900 and the apparatus described herein may further include operations, features, circuitry, logic, means, or instructions for configuring the second memory device to switch from the first mode to a second mode in response to the second memory device being mounted to the memory system, the second mode corresponding to the second memory device using the subset of pages corresponding to the second set of wordlines within the second memory device for read operations and write operations.

In some examples of the method 900 and the apparatus described herein, operations, features, circuitry, logic, means, or instructions for identifying the subset of wordlines may include operations, features, circuitry, logic, means, or instructions for identifying a first subset of wordlines within the first set of wordlines as satisfying a threshold performance degradation, failing to satisfy a threshold wordline reliability, or both resulting from subjecting the first memory device to at least the threshold temperature and identifying a second subset of wordlines within the first set of wordlines and contiguous to the first subset of wordlines, where the subset of wordlines includes the first subset of wordlines and the second subset of wordlines.

It should be noted that the methods described above describe possible implementations, and that the operations and the steps may be rearranged or otherwise modified and that other implementations are possible. Further, portions from two or more of the methods may be combined.

An apparatus is described. The apparatus may include a set of wordlines each corresponding to a respective set of at least three pages and each coupled with a respective set of memory cells, where each memory cell is operable to store at least three bits of information, each of the at least three bits included in a respective page of the respective set of at least three pages corresponding to the wordline. The apparatus may further include a controller configured to skip a subset of pages corresponding to a subset of wordlines included in the set of wordlines while performing a read operation, a write operation, or both while the apparatus is configured to operate in a first mode.

In some examples, the apparatus may further include logic configured to switch, in response to a trigger condition, the apparatus from being configured to operate in the first mode to being configured to operate in a second mode, where the controller may be configured to use the subset of pages corresponding to the subset of wordlines included in the set of wordlines while performing the read operation, the write operation, or both while the apparatus is configured to operate in the second mode.

In some examples of the apparatus, each respective set of memory cells includes tri-level memory cells, quad-level memory cells, or a combination thereof, and the subset of pages includes a respective first page for each wordline of the subset of wordlines.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit in accordance with the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, DSL, or technologies such as infrared, radio, and microwave are included in the definition of medium.

Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   one or more controllers associated with a memory device and configured to cause the apparatus to:
   operate in a first mode configured to skip a first subset of pages corresponding to a first subset of wordlines of the memory device;
   receive a first set of data while operating in the first mode;
   store the first set of data in a second subset of pages corresponding to the first subset of wordlines based at least in part on operating in the first mode, the second subset of pages distinct from the first subset of pages;
   switch, after storing the first set of data and in response to a trigger condition, from operating in the first mode to operating in a second mode configured to use each page of the first subset of pages;
   receive a second set of data while operating in the second mode; and
   store the second set of data in the first subset of pages based at least in part on operating in the second mode.

2. The apparatus of claim 1, wherein the one or more controllers are further configured to cause the apparatus to:

receive a command to switch from the first mode to the second mode, wherein the trigger condition comprises receiving the command.

3. The apparatus of claim 1, wherein the one or more controllers are further configured to cause the apparatus to:
determine that a mounting process for the memory device is complete, wherein the trigger condition comprises determining that the mounting process is complete.

4. The apparatus of claim 1, wherein the one or more controllers are further configured to cause the apparatus to:
receive a read command while operating in the first mode; and
skip the first subset of pages for a read operation in response to the read command based at least in part on operating in the first mode.

5. The apparatus of claim 1, wherein the one or more controllers are further configured to cause the apparatus to:
receive a read command while operating in the second mode; and
refrain from skipping the first subset of pages for a read operation in response to the read command based at least in part on operating in the second mode.

6. The apparatus of claim 1, wherein the first subset of wordlines is configured to satisfy a threshold capacity for the memory device.

7. The apparatus of claim 1, wherein the one or more controllers are further configured to cause the apparatus to:
reduce a voltage threshold for the first subset of wordlines based at least in part on skipping the first subset of pages corresponding to the first subset of wordlines.

8. The apparatus of claim 1, wherein the memory device satisfies a threshold reliability while operating in the second mode based at least in part on skipping the first subset of pages corresponding to the first subset of wordlines while operating in the first mode.

9. The apparatus of claim 1, wherein:
each wordline of the first subset of wordlines is coupled with a respective set of memory cells each operable to store at least three bits of information, each of the at least three bits included in a respective page of a respective set of at least three pages corresponding to a respective wordline included in the first subset of wordlines;
the first subset of pages corresponding to the first subset of wordlines comprises a respective first page for each wordline of the first subset of wordlines; and
the second subset of pages corresponding to the first subset of wordlines comprises a respective second page for each wordline of the first subset of wordlines, a respective third page for each wordline of the first subset of wordlines, or any combination thereof.

10. The apparatus of claim 9, wherein the first subset of pages is configured based at least in part on a gray code mapping from voltage threshold levels for the respective sets of memory cells to logical states for the respective sets of memory cells.

11. The apparatus of claim 1, wherein the first set of data comprises pre-programmed data for the memory device.

12. An apparatus, comprising:
a set of wordlines each corresponding to a respective set of at least three pages and each coupled with a respective set of memory cells, wherein each memory cell is operable to store at least three bits of information, each of the at least three bits included in a respective page of the respective set of at least three pages corresponding to a respective wordline included in the set of wordlines;
one or more controllers configured to skip a subset of pages corresponding to a subset of wordlines included in the set of wordlines while performing a read operation, a write operation, or both while the apparatus is configured to operate in a first mode; and
logic configured to switch, in response to a trigger condition, the apparatus from being configured to operate in the first mode to being configured to operate in a second mode, wherein the one or more controllers are configured to use the subset of pages corresponding to the subset of wordlines included in the set of wordlines while performing the read operation, the write operation, or both while the apparatus is configured to operate in the second mode.

13. The apparatus of claim 12, wherein:
each respective set of memory cells comprises tri-level memory cells, quad-level memory cells, or a combination thereof; and
the subset of pages comprises a respective first page for each wordline of the subset of wordlines.

14. A method, comprising:
pre-programming memory cells coupled with a first set of wordlines within a first memory device to store a set of data;
subjecting the first memory device, after pre-programming the memory cells, to at least a threshold temperature;
identifying a subset of wordlines within the first set of wordlines based at least in part on a performance degradation for the subset of wordlines resulting from subjecting the first memory device to at least the threshold temperature; and
configuring a second memory device to skip a subset of pages corresponding to a second set of wordlines within the second memory device for read operations and write operations based at least in part on a threshold reliability for the second memory device, the second set of wordlines and the subset of wordlines having corresponding wordline indices.

15. The method of claim 14, further comprising:
identifying the subset of pages corresponding to the second set of wordlines based at least in part on a threshold capacity for the second memory device.

16. The method of claim 14, wherein the configuring comprises:
configuring the second memory device to operate in a first mode prior to the second memory device being mounted to a memory system, the first mode corresponding to the second memory device skipping the subset of pages corresponding to the second set of wordlines within the second memory device for read operations and write operations.

17. The method of claim 16, further comprising:
configuring the second memory device to switch from the first mode to a second mode in response to the second memory device being mounted to the memory system, the second mode corresponding to the second memory device using the subset of pages corresponding to the second set of wordlines within the second memory device for read operations and write operations.

18. The method of claim 14, wherein identifying the subset of wordlines comprises:
identifying a first subset of wordlines within the first set of wordlines as satisfying a threshold performance degradation, failing to satisfy a threshold wordline reliability, or both resulting from subjecting the first memory device to at least the threshold temperature; and identifying a second subset of wordlines within the first set of wordlines and contiguous to the first subset of wordlines, wherein the subset of wordlines comprises the first subset of wordlines and the second subset of wordlines.

19. A non-transitory computer-readable medium storing code comprising instructions which, when executed by a processor of an electronic device, cause the electronic device to:

operate in a first mode configured to skip a first subset of pages corresponding to a first subset of wordlines of a memory device;

receive a first set of data while operating in the first mode;

store the first set of data in a second subset of pages corresponding to the first subset of wordlines based at least in part on operating in the first mode, the second subset of pages distinct from the first subset of pages;

switch, after storing the first set of data and in response to a trigger condition, from operating in the first mode to operating in a second mode configured to use each page of the first subset of pages;

receive a second set of data while operating in the second mode; and store the second set of data in the first subset of pages based at least in part on operating in the second mode.

20. The non-transitory computer-readable medium of claim 19, wherein the instructions, when executed by the processor of the electronic device, further cause the electronic device to:

receive a command to switch from the first mode to the second mode, wherein the trigger condition comprises receiving the command.

21. The non-transitory computer-readable medium of claim 19, wherein the instructions, when executed by the processor of the electronic device, further cause the electronic device to:

determine that a mounting process for the memory device is complete, wherein the trigger condition comprises determining that the mounting process is complete.

22. The non-transitory computer-readable medium of claim 19, wherein the instructions, when executed by the processor of the electronic device, further cause the electronic device to:

receive a read command while operating in the first mode; and skip the first subset of pages for a read operation in response to the read command based at least in part on operating in the first mode.

23. The non-transitory computer-readable medium of claim 19, wherein the instructions, when executed by the processor of the electronic device, further cause the electronic device to:

receive a read command while operating in the second mode; and refrain from skipping the first subset of pages for a read operation in response to the read command based at least in part on operating in the second mode.

24. The non-transitory computer-readable medium of claim 19, wherein the first subset of wordlines is configured to satisfy a threshold capacity for the memory device.

25. The non-transitory computer-readable medium of claim 19, wherein the instructions, when executed by the processor of the electronic device, further cause the electronic device to:

reduce a voltage threshold for the first subset of wordlines based at least in part on skipping the first subset of pages corresponding to the first subset of wordlines.

26. The non-transitory computer-readable medium of claim 19, wherein the memory device satisfies a threshold reliability while operating in the second mode based at least in part on skipping the first subset of pages corresponding to the first subset of wordlines while operating in the first mode.

27. The non-transitory computer-readable medium of claim 19, wherein:

each wordline of the first subset of wordlines is coupled with a respective set of memory cells each operable to store at least three bits of information, each of the at least three bits included in a respective page of a respective set of at least three pages corresponding to a respective wordline included in the first subset of wordlines;

the first subset of pages corresponding to the first subset of wordlines comprises a respective first page for each wordline of the first subset of wordlines; and the second subset of pages corresponding to the first subset of wordlines comprises a respective second page for each wordline of the first subset of wordlines, a respective third page for each wordline of the first subset of wordlines, or any combination thereof.

28. The non-transitory computer-readable medium of claim 27, wherein the first subset of pages is configured based at least in part on a gray code mapping from voltage threshold levels for the respective sets of memory cells to logical states for the respective sets of memory cells.

29. The non-transitory computer-readable medium of claim 19, wherein the first set of data comprises pre-programmed data for the memory device.

30. A method, comprising:

operating in a first mode configured to skip a first subset of pages corresponding to a first subset of wordlines of a memory device;

receiving a first set of data while operating in the first mode;

storing the first set of data in a second subset of pages corresponding to the first subset of wordlines based at least in part on operating in the first mode, the second subset of pages distinct from the first subset of pages;

switching, after storing the first set of data and in response to a trigger condition, from operating in the first mode to operating in a second mode configured to use each page of the first subset of pages;

receiving a second set of data while operating in the second mode; and storing the second set of data in the first subset of pages based at least in part on operating in the second mode.

31. The method of claim 30, further comprising:

receiving a command to switch from the first mode to the second mode, wherein the trigger condition comprises receiving the command.

32. The method of claim 30, further comprising:

determining that a mounting process for the memory device is complete, wherein the trigger condition comprises determining that the mounting process is complete.

33. The method of claim 30, further comprising:

receiving a read command while operating in the first mode; and skipping the first subset of pages for a read operation in response to the read command based at least in part on operating in the first mode.

34. The method of claim 30, further comprising:
receiving a read command while operating in the second mode; and
refraining from skipping the first subset of pages for a read operation in response to the read command based at least in part on operating in the second mode.

* * * * *